United States Patent
Cartier et al.

(10) Patent No.: US 6,753,556 B2
(45) Date of Patent: Jun. 22, 2004

(54) SILICATE GATE DIELECTRIC

(75) Inventors: Eduard Albert Cartier, New York, NY (US); Matthew Warren Copel, Yorktown Heights, NY (US); Frances Mary Ross, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 72 days.

(21) Appl. No.: 09/413,462

(22) Filed: Oct. 6, 1999

(65) Prior Publication Data

US 2002/0005556 A1 Jan. 17, 2002

(51) Int. Cl.[7] .............................................. H01L 23/48
(52) U.S. Cl. ................... 257/213; 257/381; 257/388; 438/142
(58) Field of Search .................... 257/381, 382, 257/383, 384, 388; 438/142

(56) References Cited

U.S. PATENT DOCUMENTS

| | | | | |
|---|---|---|---|---|
| 4,392,150 A | * | 7/1983 | Courreges | 357/51 |
| 4,432,035 A | * | 2/1984 | Hsieh et al. | 361/322 |
| 4,604,641 A | * | 8/1986 | Konishi | 357/59 |
| 5,045,916 A | * | 9/1991 | Vor et al. | 357/71 |
| 5,306,950 A | * | 4/1994 | Fujikawa et al. | 257/750 |
| 5,313,089 A | * | 5/1994 | Jones, Jr. | 257/295 |
| 5,405,796 A | * | 4/1995 | Jones, Jr. | 437/47 |
| 5,418,179 A | * | 5/1995 | Hotta | 437/57 |
| 5,569,628 A | * | 10/1996 | Yano et al. | 437/245 |
| 5,898,720 A | * | 4/1999 | Yamamoto et al. | 372/39 |
| 6,020,243 A | | 2/2000 | Wallace et al. | |
| 6,028,873 A | * | 2/2000 | Yamamoto et al. | 372/39 |
| 6,046,748 A | * | 4/2000 | Horowitz et al. | 257/350 |
| 6,101,203 A | * | 8/2000 | Yamamoto et al. | 372/39 |
| 6,211,057 B1 | * | 4/2001 | Lin et al. | 438/619 |
| 6,236,094 B1 | * | 5/2001 | Wright | 257/413 |

OTHER PUBLICATIONS

Wilk, et al., "Electrical Properties of Hafnium Silicate Gate Dielectrics Deposited Directly on Silicon," Applied Physics Letters, vol. 74, No. 19, pp. 2854–2856 (1999).

* cited by examiner

*Primary Examiner*—David L. Talbott
*Assistant Examiner*—Lourdes Cruz
(74) *Attorney, Agent, or Firm*—Scully, Scott, Murphy & Presser; Robert M. Trepp

(57) ABSTRACT

A method of forming a silicate dielectric having superior electrical properties comprising forming a metal oxide layer on a Si-containing semiconductor material and reacting the metal oxide with the underlying Si-containing material in the presence of an oxidizing gas is provided. Semiconductor structures comprising the metal silicate formed over a $SiO_2$ layer are also disclosed herein.

5 Claims, 7 Drawing Sheets

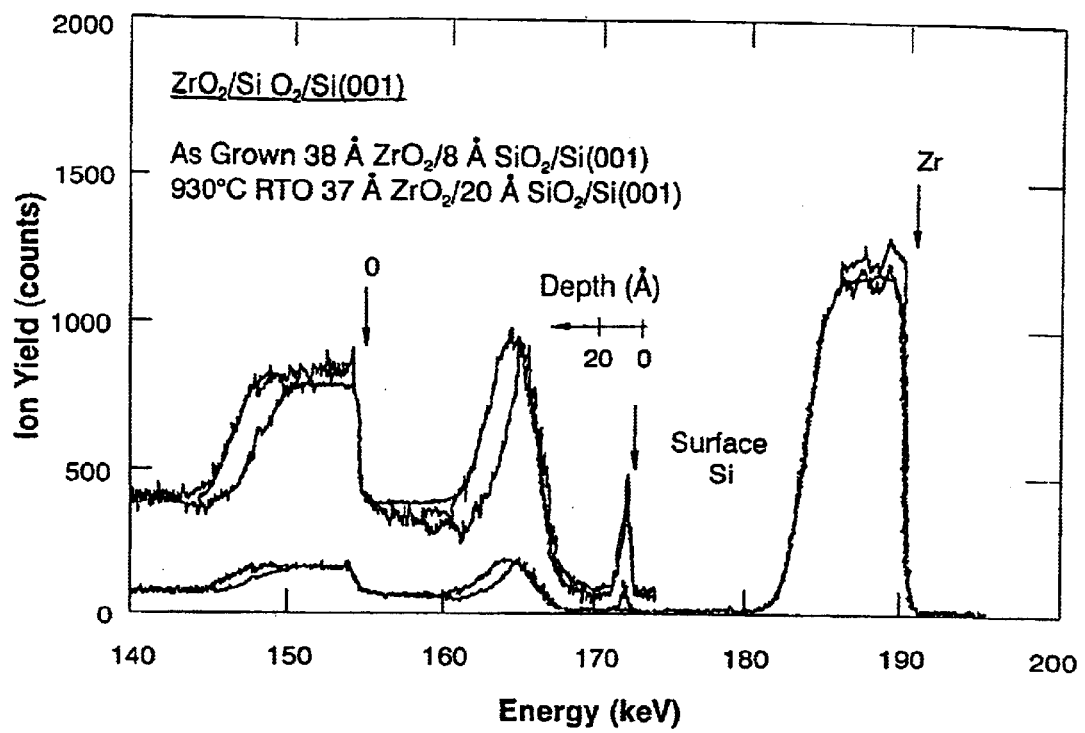
Fig. 4
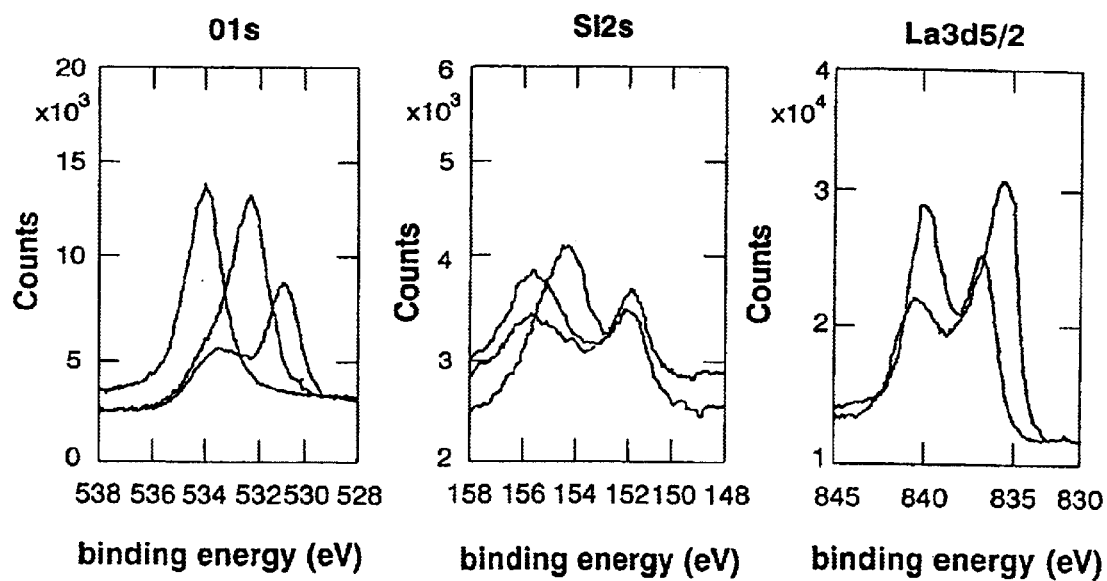
Fig. 5a   Fig. 5b   Fig. 5c in # SILICATE GATE DIELECTRIC

RELATED APPLICATIONS

This application is related to U.S. application Ser. No. 08/431,349, filed Apr. 28, 1995 by R. B. Laibowitz, et al., entitled "Lead Silicate Based Capacitor Structures."

FIELD OF THE INVENTION

The present invention relates to a method of fabricating silicate dielectrics that have superior electrical properties compared with $SiO_2$ and to semiconductor structures such as field effect transistors (FETs) which contain the same.

BACKGROUND OF THE INVENTION

In the field of semiconductor transistor manufacturing, the formation of a gate dielectric is a critical step in the fabrication process. It is highly desirable in such art to reduce the leakage current that is caused by electron tunneling through the $SiO_2$ layer conventionally used as the gate dielectric.

One approach to improving the electrical characteristics of the gate dielectric is to use an alternative dielectric material with a larger dielectric constant than $SiO_2$; allowing the use of a greater physical thickness for the gate insulator.

Numerous transition metal oxides have larger dielectric constants than $SiO_2$; however maintaining compatibility with standard silicon processing is a tremendous challenge.

A complete discussion on the above compatibility problem is provided by K. J. Hubbard, et al. "Thermodynamic Stability of Binary Oxides in Contact With Silicon," J. Mater. Res., Vol. 11, No. 11, pp. 2757–2776 (1996).

There is thus a need for developing a method of fabricating dielectric materials having dielectric constants greater than $SiO_2$ which maintain compatibility with standard silicon processing. There is also a need for developing a method of fabricating dielectric materials in which the electrical properties of the dielectric are superior to $SiO_2$ dielectrics heretofore known.

SUMMARY OF THE INVENTION

One object of the present invention is to provide a method of fabricating a dielectric material which maintains compatibility with standard silicon processing.

Another object of the present invention is to provide a method of fabricating a dielectric material having a dielectric constant greater than $SiO_2$.

A further object of the present invention is to provide a method of fabricating a dielectric material which can significantly reduce the leakage current normally associated with an $SiO_2$ dielectric.

A yet further object of the present invention is to provide a simple method of forming a silicate/$SiO_2$ gate stack with a self-limiting oxide equivalent thickness.

These and other objects and advantages are obtained in the present invention by oxidizing a metal oxide layer that is formed on a silicon substrate under conditions sufficient to convert the metal oxide layer into a silicate by intermixing with the underlying silicon, while simultaneously oxidizing the underlying silicon. Specifically, the method of the present invention comprises the steps of:

(a) forming a metal oxide layer on a silicon-containing material; and
(b) heating the metal oxide layer in the presence of an oxidizing agent under conditions so as to convert the metal oxide layer into a metal silicate layer while simultaneously oxidizing a portion of the silicon-containing material underlying the metal silicate layer.

In one embodiment of the present invention, the method of the present invention further comprises annealing the metal silicate layer produced in step (b) above.

In yet another embodiment of the present invention, an elemental metal layer is formed on the silicon-containing material and thereafter step (b) is performed. In this embodiment, the oxidation step, step (b), is carried out under conditions that are effective in transforming the metal layer to a metal oxide layer and then to a metal silicate layer.

Another aspect of the present invention relates to semiconductor structures such as capacitors and transistors which include at least the metal silicate produced by the method of the present invention therein. Specifically, the inventive semiconductor structures comprise at least a metal silicate that is formed on a silicon oxide layer, said silicon oxide layer being formed on a Si-containing substrate.

Another aspect of the present invention relates to a field effect transistor which comprises a Si-containing semiconductor substrate;

spaced apart source and drain regions in said substrate, said spaced apart source/drain regions defining a channel region;

a dielectric layer above said channel region, said dielectric layer including a first layer of a metal silicate; and
a gate electrode formed over said dielectric layer.

BRIEF DESCRIPTION OF THE DRAWINGS

FIG. 4 is a graph of ion yield vs. energy showing the effect of post-oxidation on a $ZrO_2$/$SiO_2$/Si structure.

FIGS. 5a–c are X-ray photoemission spectroscopy results for the formation of lanthanum silicate.

DETAILED DESCRIPTION OF THE INVENTION

Figure 1A:
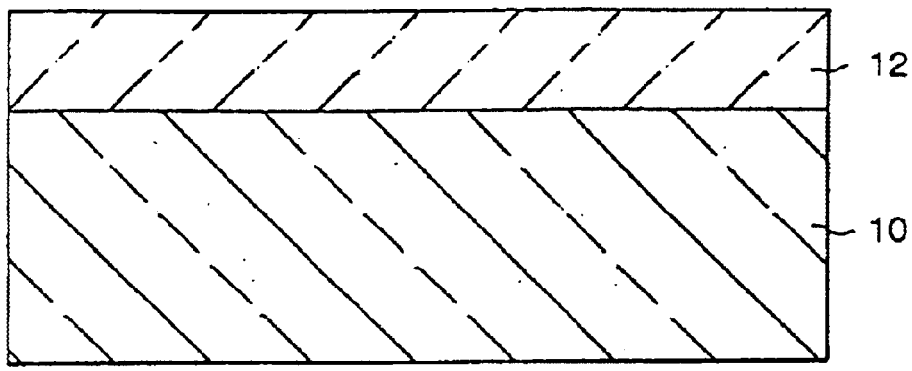
FIGS. 1a–b illustrate cross-sectional views of a structure during different processing steps of the present invention (1a prior to oxidation and 1b after oxidation).

The present invention which provides a method for forming a metal silicate having superior electrical properties will now be described in greater detail by referring to the drawings that accompany the present application. It is noted that in the drawings like reference numerals are used for describing like and/or corresponding elements.

Reference is first made to FIGS. 1a–1b and 2a–b which illustrate the basic processing steps that are employed in the present invention. Specifically, FIG. 1a shows a structure which comprises a silicon-containing material 10 and a metal oxide layer 12 formed on said silicon-containing material.

Figure 2A:
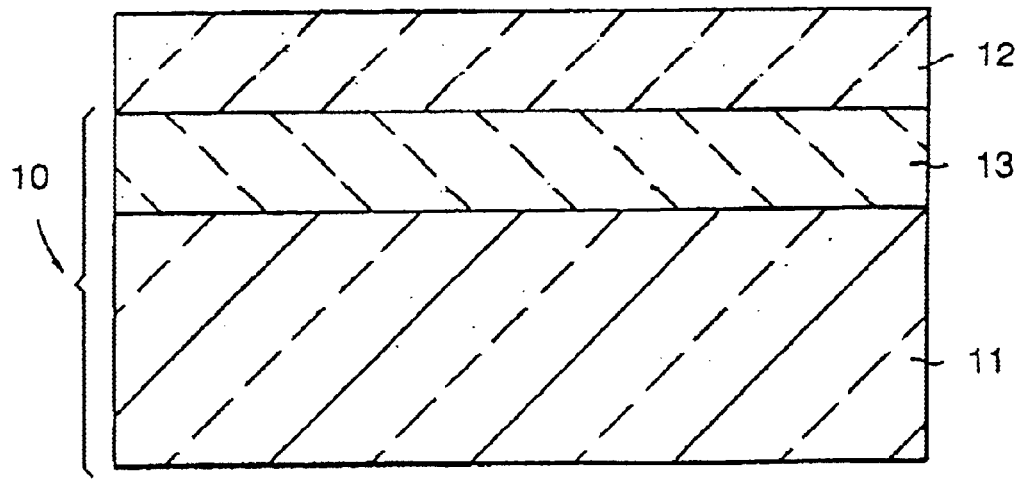
FIGS. 2a–b illustrate cross-sectional views of another structure during different processing steps of the present invention (2a prior to oxidation and 2b after oxidation).

Suitable silicon-containing materials that can be employed in the present invention include conventional materials such as Si-containing semiconductor substrates, silicon-on-insulators, sapphire, $SiO_2$, SiGe, Si oxynitride or combinations thereof. The present invention also contemplates a layered substrate such as substrates containing layers of Si; Ge; SiGe and Si; SiGe, Si and Ge; and SiGe. A preferred silicon-containing material employed in the present invention is a Si-containing semiconductor substrate 11 having a thin layer 13 of $SiO_2$ or Si oxynitride formed thereon. Such a structure is shown in FIG. 2a. It is also possible to employ a Si-containing substrate that has a native oxide layer located near the surface of the substrate or to employ a bare Si-containing substrate.

The semiconductor substrates employed in the present invention may contain source/drain regions, isolation regions and other like regions therein. For simplicity these regions are not shown in the drawings of the present invention, but nevertheless are intended to be within regions 10 or 11.

The thin layer of $SiO_2$ or Si oxynitride may be formed on the surface of the Si-containing semiconductor substrate using conventional thermal oxidation or by a suitable deposition process such as chemical vapor deposition, plasma-assisted chemical vapor deposition, evaporation, sputtering and other like deposition processes. The thickness of the oxide or oxynitride layer is typically of from about 0 to about 25 Å. As mentioned above, the $SiO_2$ layer may be a native oxide that is inherently present in the substrate, and in one embodiment of the present invention the native oxide may be removed prior to conducting step (a).

It is noted that when an oxide or oxynitride layer is present on the structure prior to oxidation, silicon from the layer will be consumed in forming the silicate. If the oxide or oxynitride layer is completely consumed, a new $SiO_2$ layer will be formed between the silicate and the substrate during the oxidation step of the present invention. In this sense, the growth is self-limiting; the thickness of the silicate is controlled by the amount of metal oxide deposited, and the thickness of the underlying $SiO_2$ layer is controlled by the oxidation kinetics during the post-deposition oxidation step. If the preexisting oxide or oxynitride layer is sufficiently thick, then it will not be entirely consumed in the post-deposition oxidation step, and the preexisting Si/$SiO_2$ interface will remain intact.

Metal oxide layer 12 of the present invention comprises oxygen and at least one metal selected from the group consisting of La, Hf, Y, Sc, Sr, Ba, Ti, Ta, W, Cr, Ca, Mg, Be, Pr, Nd and any other transitional metal or rare earth metal that is capable of forming an oxide. The metals employed in the present invention must also be capable of intermixing with the underlying Si so as to form a metal silicate during oxidation treatment. Mixtures and alloys of one or more of these metals is also contemplated herein.

The metal oxide layer may be formed using conventional deposition processes well known to those skilled in the art including, but not limited to: chemical vapor deposition, plasma vapor deposition, evaporation, sputtering and other like deposition processes. It is also possible to employ a reactive deposition process wherein an elemental metal is deposited in the presence of an oxidizing gas ($O_2$, $N_2O$ or NO). In this case, the metal reacts with the oxidizing agent causing in-situ deposition of a metal oxide film.

In one embodiment of the present invention, instead of forming a metal oxide layer on the Si-containing material prior to oxidation, a layer comprising an elemental metal is formed on the Si-containing material. In this embodiment, the elemental metal may be one of the above-mentioned transition metals or rare earth metals. Any conventional deposition process is used in forming the metal layer which will be first converted into a metal oxide layer and then to a metal silicate during the oxidation step of the present invention.

The metal oxide or metal layer formed on the Si-containing material typically has a thickness of from about 1 to about 50 Å. More preferably, the thickness of the metal oxide or metal layer is from about 5 to about 25 Å. Other thicknesses are also contemplated herein.

In accordance with the next step of the present invention, structures FIG. 1a or 2a (or a structure containing an elemental metal layer) are then subjected to an oxidation step in which the metal layer (metal oxide or elemental metal) is heated in the presence of an oxidizing agent under conditions so as to convert the metal oxide into a metal silicate layer 14 while simultaneously oxidizing the silicon-containing material underlying the metal silicate forming $SiO_2$ layer 16. The formation of the metal silicate is believed to be caused by the intermixing of the metal oxide with the underlying silicon.

Figure 1B:
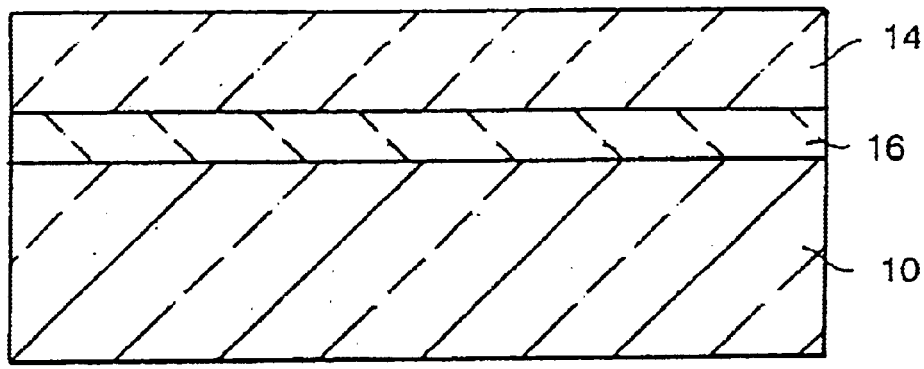
Figure 2B:
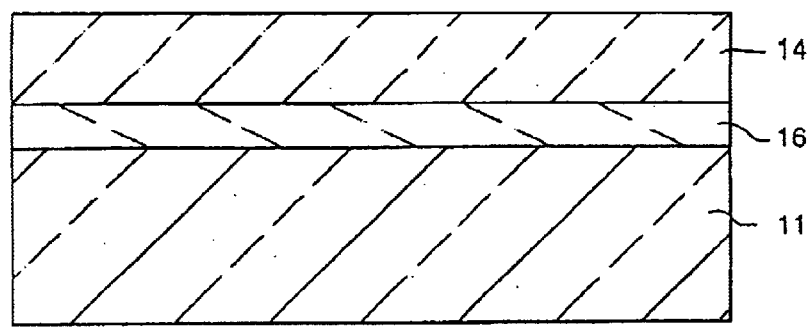

In the cases shown in FIGS. 1b and 2b, the oxidation step of the present invention causes the formation of an underlying $SiO_2$ layer 16. In the case wherein an elemental metal is deposited, the oxidation step results in the conversion of the metal layer into a metal oxide layer which in turn is converted to a metal silicate, while simultaneously forming an underlying $SiO_2$ layer beneath the metal silicate.

The oxidation step of the present invention is carried out at a temperature of less than about 950° C. for a time period of at least about 10 seconds. More preferably, the oxidation step is carried out at a temperature of from about 750° to about 900° C. for a time period of from about 60 to about 180 seconds.

The oxidizing agents employed in this step of the present invention include, but are not limited to: $O_2$, $N_2O$, NO or any other reactive gas which causes oxidation of the metal oxide layer. During oxidation, the pressure of the oxidizing agent is at least about $10^{-5}$ torr, with a pressure of from about $10^{-3}$ to about $10^{-2}$ torr being highly preferred. Other pressures are possible depending on the desired thickness of the metal silicate layer. Typically, in the present invention, the metal silicate has a thickness of from about 20 to about 50 Å, while the underlying $SiO_2$ layer formed during oxidation has a thickness of from about 5 to about 15 Å.

The present invention also contemplates using ion implantation or a layer providing a source of oxygen in place of the above mentioned oxidizing agents.

In one embodiment of the present invention, the structures shown in FIG. 1b or 2b may be subjected to a post-oxidation annealing step. This optional anneal is carried out in a forming gas atmosphere or other suitable annealing atmosphere at a temperature less than about 700° C. for a time period of greater than 1 second. More preferably, the optional anneal is carried out at a temperature of from about 350° to about 650° C. for a time period of from about 10 seconds to about 1 hour.

After formation of the metal silicate layer, electrically conductive contacts (or gate electrodes) can be formed on the surface of the metal silicate and that structure can undergo conventional transistor/capacitor processing steps. Suitable electrically conductive contacts that can be employed in the present invention include, but are not limited to: polysilicon, W, Al or Pt.

When metal silicates of the present invention are used as a dielectric material, the structures containing the same have leakage currents below $1\times10^{-4}$ amps/cm$^2$ at $-1$ volts and a capacitance density of greater than $9\times10^{-6}$ F/cm$^2$. Moreover, the metal silicates of the present invention have dielectric constants greater than SiO$_2$ (k=4). Typically, the metal silicates have dielectric constants of from about 10 to about 40. In view of these properties, the metal silicates of the present invention are viable replacements for SiO$_2$ dielectrics.

Figure 10:
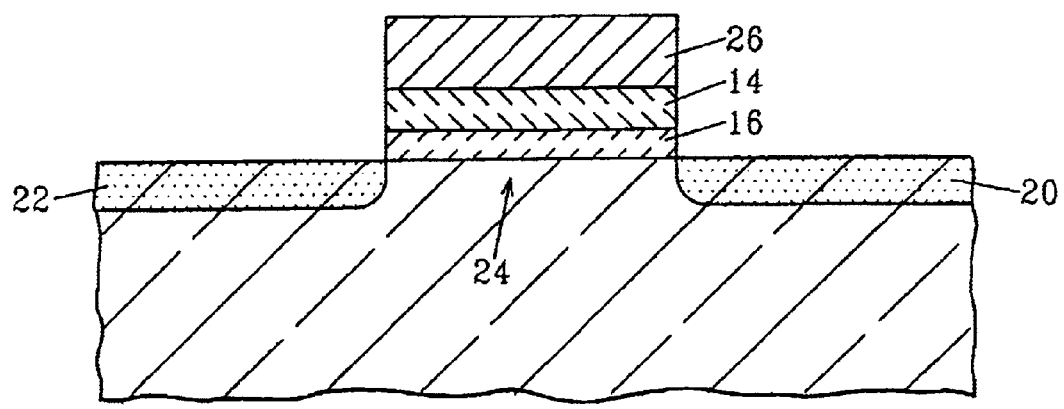
FIG. 10 is a pictorial representation (through a cross-sectional view) showing a field effect transistor (FET) of the present invention.

FIG. 10 illustrates a cross-sectional view of a FET which includes the metal silicate described above as a dielectric material. Specifically, the FET shown in FIG. 10 includes Si-containing semiconductor substrate 11 having spaced apart source and drain regions 20 and 22, respectively defining channel 24 located therein. The FET also includes SiO$_2$ layer 16 located above channel 24, metal silicite layer 14 located atop SiO$_2$ layer 16, and gate electrode 26 located atop metal silicate layer 14. The gate electrode comprises polysilicon, W, Al or Pt.

Figure 11:
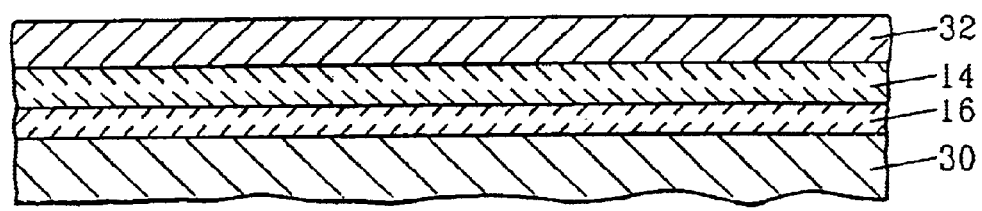
FIG. 11 is a pictorial representation (through a cross-sectional view) showing a capacitor structure of the present invention.

FIG. 11 illustrates a cross-sectional view of a capacitor which include the metal silicate described above as a dielectric material. Specifically, the capacitor structure includes conductive electrodes 30 and 32 respectively, and SiO$_2$ layer 16 and metal silicate layer 14 sandwiched therebetween.

The following example is given to illustrate the present invention as well as to demonstrate some advantages that are obtained by using the same.

EXAMPLE

In this example, a La$_2$Si$_2$O$_7$ dielectric film is formed using the method of the present invention. Specifically, a Si (100) substrate containing a 25 Å thick thermal oxide formed by N$_2$O oxidation was used as the Si-containing semiconductor material. If the oxide surface was exposed to atmosphere prior to use, it can be heated in vacuum at 500°–600° C. for between 10 minutes and 24 hours to reduce surface contamination.

A 20 Å thick layer of La$_2$O$_3$ was e-beam evaporated from a La$_2$O$_3$ target. The La oxide layer was then oxidized at 880° C. in $6\times10^{-3}$ torr of O$_2$ for about 2 minutes. Afterwards, the sample was treated by a forming gas anneal at 400° C. for about 20 minutes.

This resulted in a metal silicate film having 40 Å of La$_2$Si$_2$O$_7$ on 13 Å of SiO$_2$, as measured by medium energy ion scattering. The oxide equivalent thickness (EOT) by C(V) measurements is 19 Å. Films with smaller EOT can be made by a combination of decreasing the thickness of the preexisting oxide, reducing the quantity of La$_2$O$_3$ deposited, and lowering the pressure during the post-deposition oxidation.

Experimental Results

Figure 3:
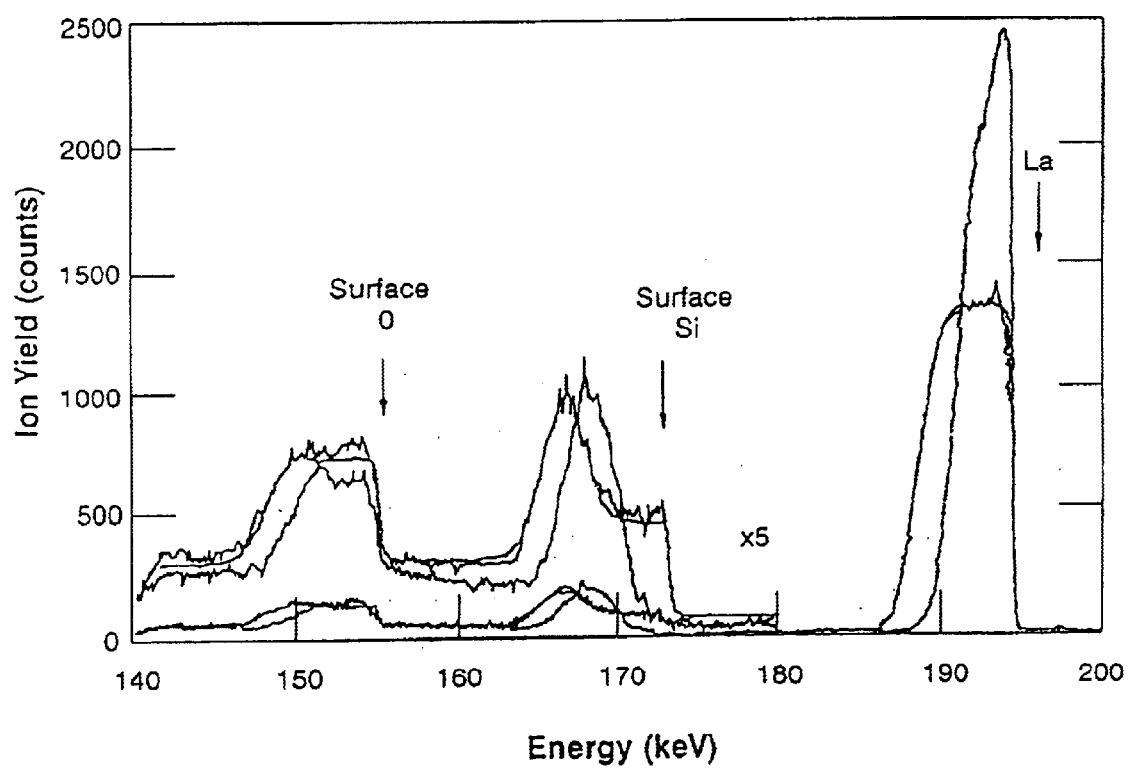
FIG. 3 is a graph of ion yield vs. energy showing the effect of post-oxidation on a $La_2O_3$/$SiO_2$/Si structure of the present invention.

MEIS (medium energy ion scattering) spectra for films during various stages of processing are shown in FIG. 3. Deposition of a 20 Å thick La$_2$O$_3$ film on a 20 Å SiO$_2$ layer shifted the position of the Si peak below the expected position for surface Si. This is due to the energy loss the ions experience in traversing the La$_2$O$_3$ layer to reach the SiO$_2$. With heating in O$_2$, the leading edge of the silicon signal processed towards high energies, reaching the position for surface Si after the 880° C. oxidation. At this point, the silicate formation was complete, and the spectrum can be accurately modeled as a stoichiometric La$_2$Si$_2$O$_7$ layer.

The formation of a silicate layer is not obvious, since it does not occur for all metal oxides. For example, if ZrO$_2$ is substituted for La$_2$O$_3$, no silicate forms. This is shown in FIG. 4 where a 38 Å thick ZrO$_2$ layer on 8 Å of SiO$_2$ on Si (001) was used and was heated to 930° C. in 0.1 torr of O$_2$. The underlying SiO$_2$ layer had grown thicker, but the Si and Zr had not intermixed to form a silicate.

Core-level photoelectron spectroscopy results showed that the La$_2$O$_3$ and Si formed a distinct silicate, rather than a mixture of phase separated components. FIGS. 5a–c show x-ray photoelectron spectra for films in various stages of reaction. The O1s core line has a binding energy of 533.8 eV for SiO$_2$. After La$_2$O$_3$ was deposited, two peaks are visible at 533 and 530.5 eV, the latter corresponding to the oxygen in the La$_2$O$_3$. When the sample was reacted, the oxygen levels combined to form a single peak at 532.1 eV. The shift in the oxygen core to a position in between the O—La and O—Si positions indicated that each oxygen atom has a O—Si and an O—La bond. This is only possible if a compound had formed. The shift is chemical in nature, because the Si$_{2s}$ core line at 151.4 due to the substrate remains unchanged when the reaction occurs. A shift in the La$_3$d5/2 peak towards higher binding energy was also observed as a result of silicate formation.

Figure 6:
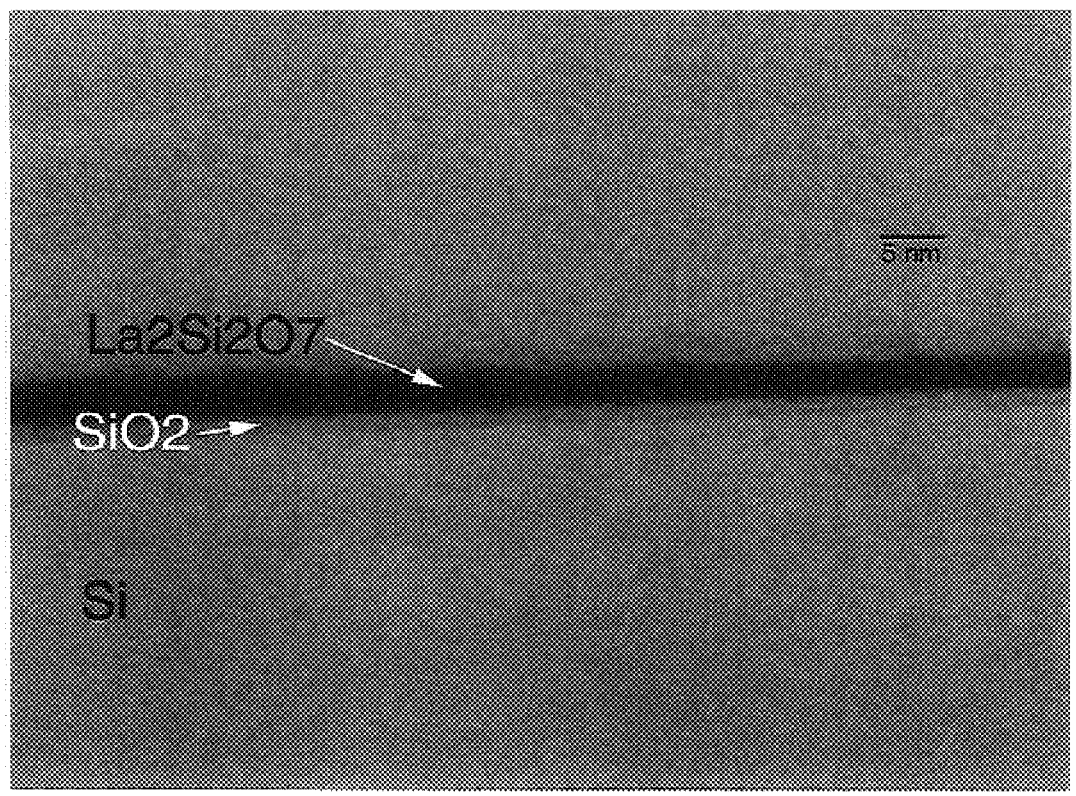
FIG. 6 is a cross-sectional TEM image of lanthanum silicate/$SiO_2$/Si (001) structure of the present invention.
Figure 7:
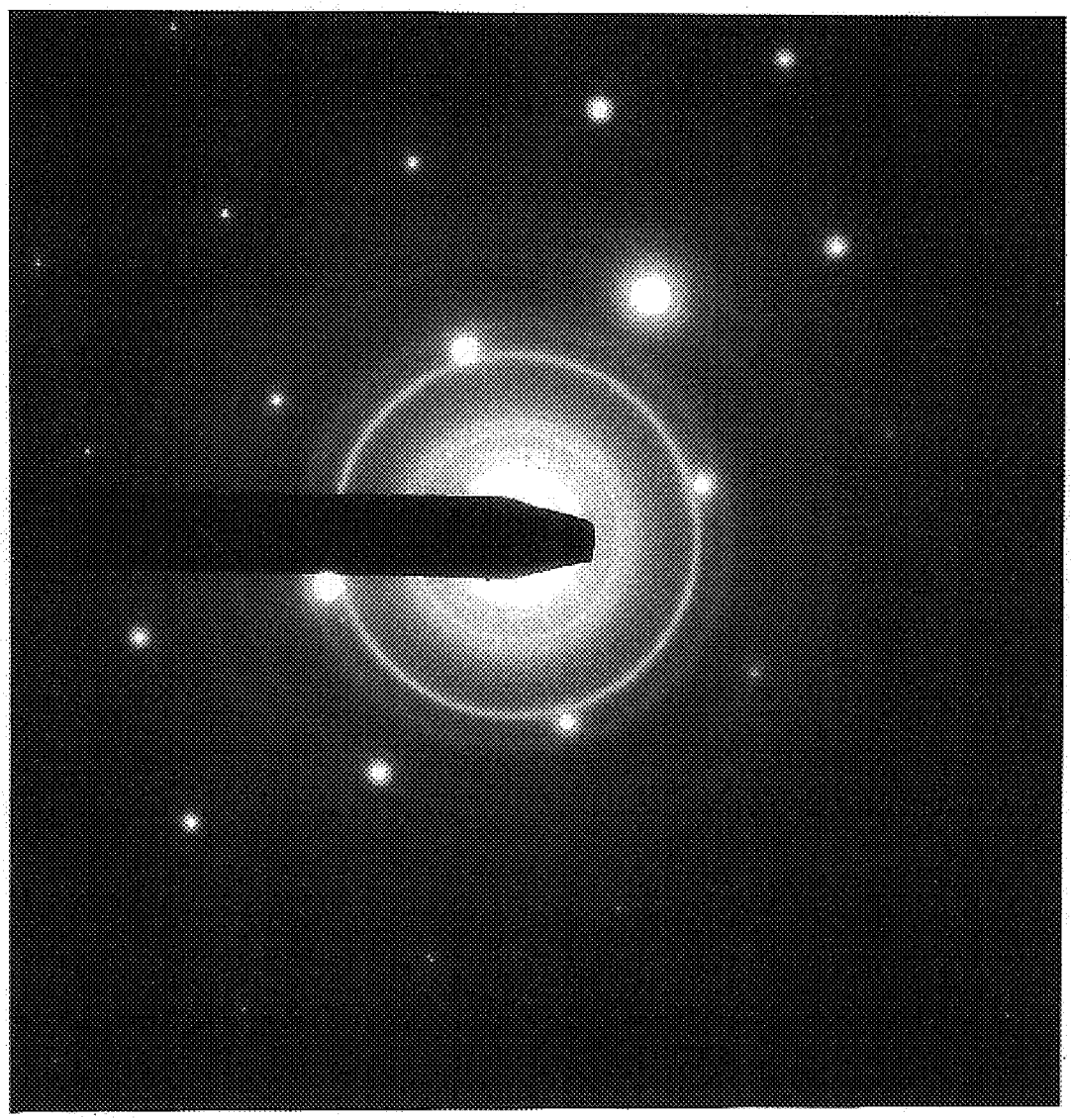
FIG. 7 is a TEM diffraction pattern of a lanthanum silicate film of the present invention.

Examination of the films by transmission electron microscopy revealed that the silicate was microcrystalline in nature, having a diffraction pattern characterized by a series of rings (FIG. 7). From dark field imaging, it was established that the domain size was roughly 50 Å. Cross-sectional images confirmed that the film was composed of a bilayer, with the top layer consisting of denser material (FIG. 6). Given the MEIS results, it was reasonable to conclude that the darker region was the lanthanum silicate, and the lighter region was composed of SiO$_2$. The image also showed that the silicon-dielectric interface was flat, which is essential to carrier mobility in a FET.

Figure 8:
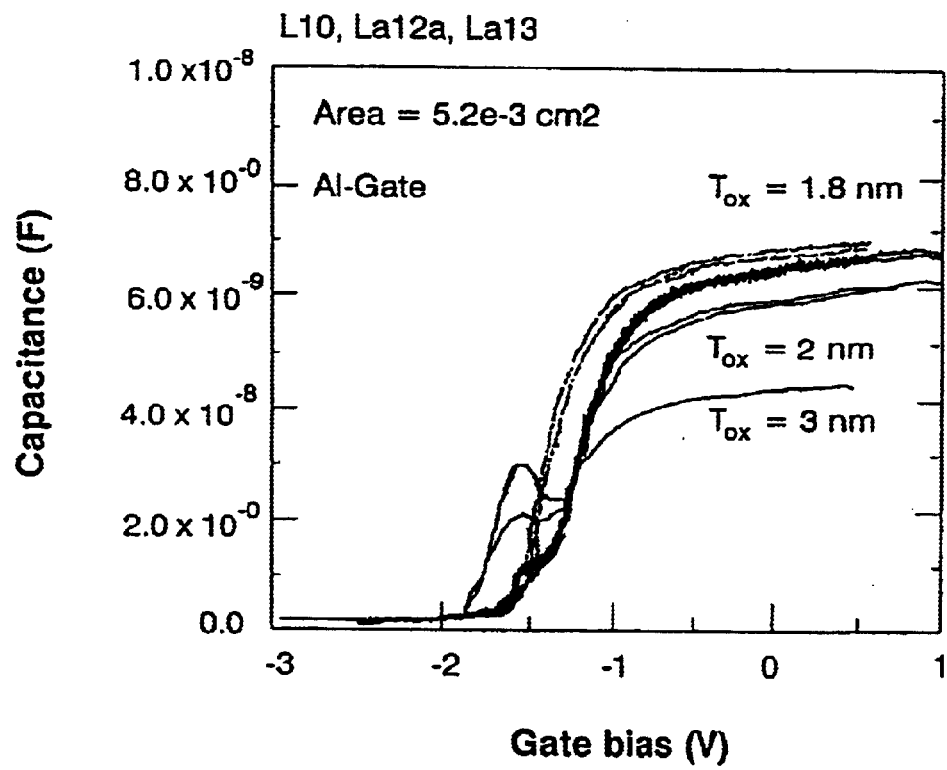
FIG. 8 is a graph of capacitance vs. gate biases for the inventive La silicate capacitor with Al contacts.
Figure 9:
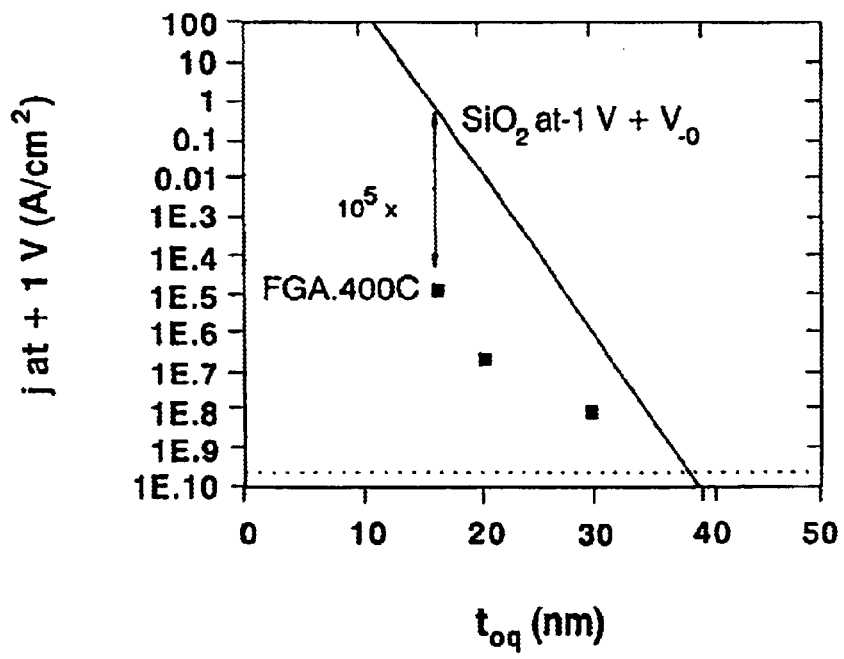
FIG. 9 is a graph illustrating the leakage current density for the inventive La silicate capacitor after conducting a forming gas anneal step.

Al contacts were evaporated onto the silicate layer for electrical measurements. The capacitance of the dielectric stack was equivalent to an oxide thickness of less than 20 Å (FIG. 8). The C(V) curves show a feature at $-1.5$V indicative of undesirable defect states. The feature was absent from samples that underwent a 400° C. forming gas anneal. Leakage current measurements indicated that after a forming gas anneal, the leakage was $10^5$ less than would occur with an SiO$_2$ film with the same capacitance (FIG. 9).

While the present invention has been particularly shown and described with respect to preferred embodiments thereof, it will be understood by those skilled in the art that the foregoing and other changes in form and detail may be made without departing from the spirit and scope of the present invention. It is therefore intended that the present invention not be limited to the exact forms described and illustrated but fall within the scope of the appended claims.

Having thus described our invention in detail, what we claim as new and desire to secure by the Letters Patent is:

1. A field effect transistor comprising:
    a Si-containing semiconductor substrate;
    spaced apart source/drain regions in said substrate defining a channel region therein;
    a dielectric layer located atop said channel region, said dielectric layer including a bottom SiO$_2$ layer and a top metal silicate layer; and
    a gate electrode located directly on an upper horizontal surface of said top metal silicate layer.

2. The field effect transistor of claim 1, wherein said metal silicate comprises at least a metal selected from the group consisting of La, Hf, Y, Sc, Sr, Ba, Ti, Ta, W, Cr, Ca, Mg, Be, Pr, Nd and mixtures and alloys thereof.

3. The field effect transistor of claim 2, wherein said metal is La, Hf or Y.

4. The field effect transistor of claim 1, wherein said silicate is La silicate.

5. The field effect transistor of claim 1, wherein said gate electrode comprises polysilicon, W, Al or Pt.

* * * * *

UNITED STATES PATENT AND TRADEMARK OFFICE
CERTIFICATE OF CORRECTION

PATENT NO.    : 6,753,556 B2
DATED         : June 22, 2004
INVENTOR(S)   : Eduard A. Cartier et al.

It is certified that error appears in the above-identified patent and that said Letters Patent is hereby corrected as shown below:

Title page,
Item [56], References Cited, U.S. PATENT DOCUMENTS, please insert the following:
-- 5,190,888  *  3/2/93    Schwalke et .............
   5,258,640  *  11/2/93   Hsich et al ..............
   5,541,131  *  7/30/96   Yoo et al ................
   5,554,560  *  9/10/96   Hsue et al................
   5,672,898  *  9/30/97   Keller et al...............
   5,852,318  *  12/22/98  Chikamatsu et al........
   5,876,788  *  3/2/99    Bronner et al............ --
OTHER PUBLICATIONS, please insert the following:
-- Hubbard, et al., "Thermodynamic Stability of Binary Oxides in Contact With Silicon," J. Mater. Res., Vol. 81 No. 11, pp. 2757-2776 (1996)

McKee, et al., "Crystalline Oxides on Silicon: The First Five Monolayers," Physical Review Letters, Vol. 81, No. 14, pp. 3014-3017 (1998) --

Signed and Sealed this

Twelfth Day of July, 2005

JON W. DUDAS
*Director of the United States Patent and Trademark Office*